(12) United States Patent
Terui et al.

(10) Patent No.: US 9,694,523 B2
(45) Date of Patent: *Jul. 4, 2017

(54) SEMICONDUCTOR MANUFACTURING APPARATUS

(71) Applicant: SII Semiconductor Corporation, Chiba-shi, Chiba (JP)

(72) Inventors: Yasuo Terui, Chiba (JP); Masaru Akino, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/054,851

(22) Filed: Feb. 26, 2016

(65) Prior Publication Data

US 2016/0176088 A1 Jun. 23, 2016

Related U.S. Application Data

(63) Continuation of application No. 14/494,664, filed on Sep. 24, 2014, now Pat. No. 9,296,142.

(30) Foreign Application Priority Data

Sep. 26, 2013 (JP) ................................. 2013-200160
Jul. 28, 2014 (JP) ................................. 2014-153271

(51) Int. Cl.
*H01L 21/56* (2006.01)
*B29C 45/14* (2006.01)
(Continued)

(52) U.S. Cl.
CPC .. *B29C 45/14065* (2013.01); *B29C 45/14655* (2013.01); *B29C 45/32* (2013.01);
(Continued)

(58) Field of Classification Search
CPC .... B29C 45/14065; B29C 2045/14147; B29C 45/14655; B29C 45/401; H01L 21/565
(Continued)

(56) References Cited

U.S. PATENT DOCUMENTS

| 4,954,308 A | 9/1990 | Yabe et al. ............... 264/272.17 |
| 9,296,142 B2 * | 3/2016 | Terui et al. ........ B29C 45/14065 |
| 2008/0020510 A1 | 1/2008 | Kuratomi et al. ............ 438/107 |

FOREIGN PATENT DOCUMENTS

| JP | 06244312 A * | 9/1994 |
| JP | 07030030 | 1/1995 |

(Continued)

OTHER PUBLICATIONS

Partial machine translation of JP 06-244312 A dated Sep. 2, 1994.*

(Continued)

*Primary Examiner* — Robert B Davis
(74) *Attorney, Agent, or Firm* — Adams & Wilks

(57) ABSTRACT

A semiconductor device manufacturing apparatus for encapsulating with a resin a semiconductor chip includes upper and lower molds configured to receive therebetween a lead frame on which the semiconductor chip is mounted. A positioning pin provided to the lower mold is configured to be received by a positioning hole provided in the lead frame. Ejector pins provided in proximity to the positioning pin are arranged so as to be symmetrical with respect to the positioning pin.

13 Claims, 7 Drawing Sheets

(51) Int. Cl.
*B29C 45/40* (2006.01)
*B29C 45/32* (2006.01)
B29L 31/34 (2006.01)
B29K 101/10 (2006.01)
B29K 101/12 (2006.01)

(52) U.S. Cl.
CPC .......... *B29C 45/401* (2013.01); *H01L 21/565* (2013.01); *B29C 2045/14147* (2013.01); *B29K 2101/10* (2013.01); *B29K 2101/12* (2013.01); *B29L 2031/3406* (2013.01); *B29L 2031/3481* (2013.01)

(58) Field of Classification Search
USPC .................................................... 264/272.15
See application file for complete search history.

(56) References Cited

FOREIGN PATENT DOCUMENTS

| | | |
|---|---|---|
| JP | 2001007130 | 1/2001 |
| JP | 2001338940 | 12/2001 |

OTHER PUBLICATIONS

Patent Abstracts of Japan, Publication No. 10-086188, Publication Date Apr. 7, 1998.
Patent Abstracts of Japan, Publication No. 2001-007130, Publication Date Jan. 12, 2001.

* cited by examiner

SEMICONDUCTOR MANUFACTURING APPARATUS

BACKGROUND OF THE INVENTION

1. Field of the Invention

The present invention relates to a semiconductor manufacturing apparatus, and more particularly, to a semiconductor manufacturing apparatus for resin encapsulation of a lead frame on which a semiconductor chip is mounted.

2. Description of the Related Art

In a related art for resin encapsulation of a lead frame having a semiconductor chip mounted thereon, the resin encapsulation of a semiconductor device is carried out by transfer molding. The lead frame, on which the semiconductor chip is mounted and is electrically connected to leads, is inserted between an upper mold and a lower mold. Then, the upper and lower molds are clamped, and a thermosetting resin, for example, is injected therebetween via a plunger. When the resin is filled into cavities formed in the upper and lower molds, respectively, and the resin is cured, the encapsulation of the semiconductor chip is completed. In the molds described above, in order to appropriately establish the positional relationship between the cavities and the lead frame, it is necessary to position the lead frame with respect to the upper and lower molds when inserted therebetween.

As a method of positioning the lead frame so as to mount the lead frame at an appropriate position on a mold, it is a typical way to fit a positioning pin provided at a predetermined position of a mold into a positioning hole formed in a peripheral portion of the lead frame (see Japanese Published Patent Application No. 10-86188 or 2001-7130).

Miniaturization of a semiconductor device along with miniaturization and densification of electronic equipment requires higher accuracy of positioning between a lead frame and a mold. However, in those related-art methods, for the purpose of preventing deformation of the positioning hole due to interference between the positioning pin and the positioning hole when the lead frame after the resin encapsulation is released from the molds, a predetermined clearance is indispensable to be secured between the positioning pin and the positioning hole, and this clearance is a cause of low accuracy of positioning the lead frame.

With regard to high accuracy positioning between the lead frame and the mold, for example, Japanese. Published Patent Application No. 10-86188 aims for, through adoption of a movable mechanism into the positioning pin, both improving the positioning accuracy by reducing the clearance and preventing deformation of the positioning hole. However, constructing the positioning pin so as to be movable complicates a structure of the mold, and the mechanism for moving the pin itself requires a clearance, resulting in a limit to the extent of the high accuracy. Further, there is a risk of a malfunction due to a flow of the resin into the clearance portion or the like.

SUMMARY OF THE INVENTION

The present invention has been made to solve those problems inherent in the related art, and provides an apparatus for manufacturing a semiconductor device.

In order to solve the above-mentioned problems, the following measures are adopted.

First, in a semiconductor manufacturing apparatus employing a method of sandwiching a lead frame on which a semiconductor chip is mounted between a set of an upper mold and a lower mold, and filling and molding a resin at a predetermined position, a columnar portion of a tapered positioning pin provided to the lower mold has an outer diameter that is larger than an inner diameter of a positioning hole at an upper surface of the lead frame, and an ejector pin in a pair is provided in proximity to the tapered positioning pin.

Further, in the semiconductor manufacturing apparatus, the ejector pin in a pair includes a plurality of ejector pins in a group, which are arranged in proximity to the single tapered positioning pin.

Further, in the semiconductor manufacturing apparatus, the plurality of ejector pins in a group are arranged so as to be symmetrical with respect to the single tapered positioning pin.

Further, in the semiconductor manufacturing apparatus, the outer diameter of the columnar portion of the tapered positioning pin that is smaller than an inner diameter of a positioning hole at a lower surface of the lead frame.

Further, in the semiconductor manufacturing apparatus, an angle formed by slants of the positioning hole in sectional view is the same as an angle formed by slants of a conical portion of the tapered positioning pin in sectional view.

Further, in the semiconductor manufacturing apparatus, when the lead frame has a thickness of 80 μm or more, the tapered positioning pin and the ejector pin in a pair are arranged at a distance of 1.5 mm or less from each other.

Further, in the semiconductor manufacturing apparatus, when the lead frame has a thickness of 50 μm or more and less than 80 μm, the tapered positioning pin and the ejector pin in a pair are arranged at a distance of 1.0 mm or less from each other.

By setting the outer diameter of the positioning pin for the mold to be larger than the inner diameter of the positioning hole formed in the lead frame, backlash of the lead frame on the mold when the lead frame is mounted on the mold is inhibited. Further, because a straight portion for guidance of the positioning pin has a length that is equal to or smaller than a thickness of the lead frame and the ejector pin for ejecting the lead frame after mold encapsulation out of the molds after encapsulation is provided at a distance of 1.5 mm or smaller from the positioning pin, deformation of the positioning hole formed in the lead frame is inhibited. In this way, positioning with high accuracy of the lead frame with respect to the molds and inhibition of deformation of the positioning hole are attained.

DETAILED DESCRIPTION OF THE PREFERRED EMBODIMENTS semiconductor manufacturing apparatus according to embodiments of the present invention is described with reference to the attached drawings.

Figure 1:
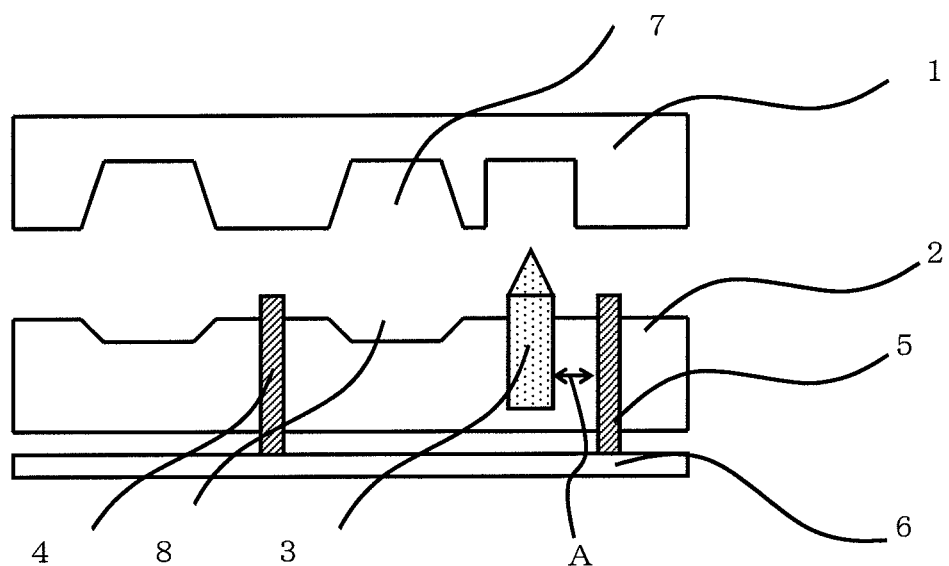
FIG. 1 is a sectional view illustrating a semiconductor manufacturing apparatus according to a first embodiment of the present invention (state before a lead frame is mounted).

FIG. 1 is a sectional view illustrating a semiconductor manufacturing apparatus according to a first embodiment of the present invention. Illustrated is a state in which upper and lower molds of a mold used when a resin encapsulated semiconductor device is manufactured are released before a lead frame is mounted. The mold includes an upper mold 1 and a lower mold 2. An upper cavity 7 and a lower cavity 8 are formed in the upper mold 1 and the lower mold 2, respectively, so as to be overlapped with each other in plan view. The upper mold 1 and the lower mold 2 are clamped to form a space for the semiconductor device.

The lower mold 2 is provided with a tapered positioning pin 3 to be engaged with a positioning hole formed in the lead frame, and an ejector pin 4 and an ejector pin 5 in a pair both for ejecting a package out of the mold after the molding. In this case, the ejector pin provided in proximity to the positioning pin 3 is referred to as the "ejector pin 5 in a pair". This is because the positioning pin 3 and the ejector pin 5 in a pair are provided in a pair with each other. The ejector pin 4 and the ejector pin 5 in a pair are fixed to an ejector pin coupling mechanism 6. The ejector pin 4 and the ejector pin 5 in a pair move up and down as the ejector pin coupling mechanism 6 moves up and down.

In this way, according to the present invention, the positioning pin 3 and the ejector pin 5 in a pair are provided in proximity to each other. When the lead frame has a thickness of 80 μm or more, it is desired that a distance A between the positioning pin 3 and the ejector pin 5 in a pair be 1.5 mm or, less. When the lead frame has a thickness of 50 μm or more and less than 80 μm, it is desired that the distance A between the positioning pin 3 and the ejector pin 5 in a pair be 1.0 mm or less.

By setting the distance in this way, the positioning pin 3 in intimate contact with the frame positioning hole for the purpose of improving positional accuracy can be easily disengaged without deforming the frame positioning hole and the deformation of the positioning hole can be prevented. Such prevention of deformation of the positioning hole results in satisfactory positional accuracy in steps thereafter.

Figure 4:
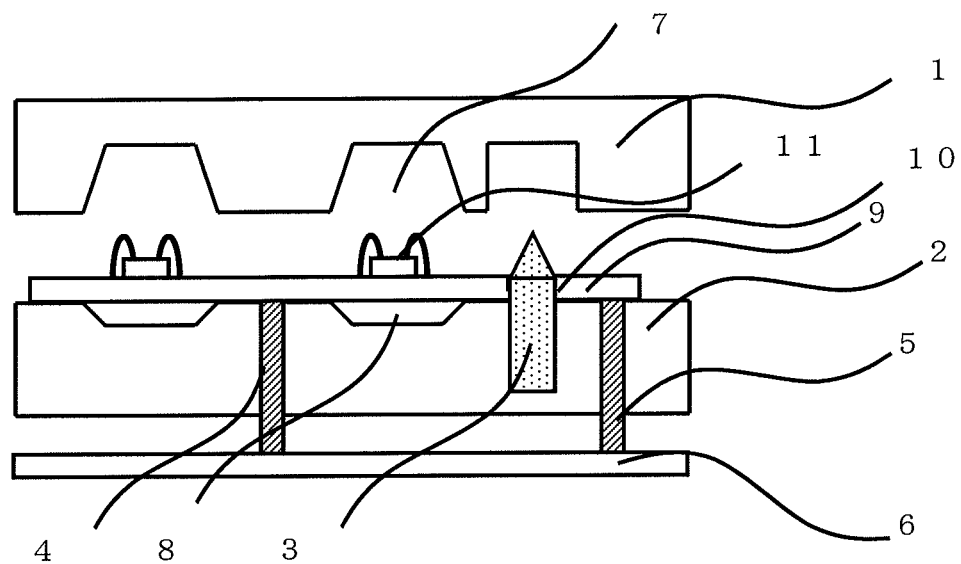
FIG. 4 is a sectional view illustrating the semiconductor manufacturing apparatus according to the first embodiment of the present invention (state in which the lead frame is mounted on a mold).

FIG. 4 illustrates a state in which a lead frame 9 is inserted between the upper mold 1 and the lower mold 2 and the lead frame 9 is mounted on the lower mold 2. A semiconductor chip 11 is die bonded to the lead frame 9, and electrodes on a surface of the semiconductor chip and leads (not shown) formed on the lead frame are connected via wires, respectively. A frame positioning hole 10 is formed in an edge portion of the lead frame (in front or at the back in plan view), and the positioning pin 3 is inserted into the frame positioning hole 10.

It is noted that when the lead frame 9 is mounted on the lower mold 2, the ejector pin 4 and the ejector pin 5 in a pair are lowered, and at least heads of the ejector pin 4 and the ejector pin 5 in a pair do not protrude from an upper surface of the lower mold 2. Although not illustrated in the figures, when the lead frame is mounted, the upper mold 1 is lowered and a thermosetting resin or a thermoplastic resin is supplied into the cavities 7 and 8 to encapsulate the semiconductor chip.

Next, engagement of the frame positioning hole 10 formed in the lead frame and the positioning pin 3 is described with reference to FIGS. 2 and 3A to 3C.

Figure 2:
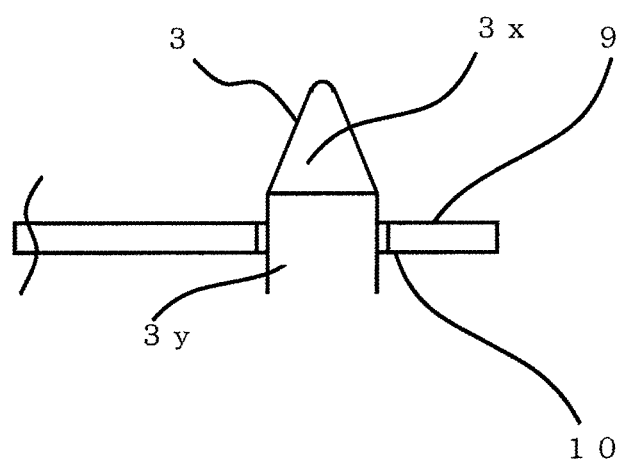
FIG. 2 is a sectional view illustrating a lead frame positioning hole and a positioning pin in related art.

FIG. 2 is a sectional view illustrating a lead frame positioning hole and a positioning pin in related art. The positioning pin 3 has a shape in which a conical portion 3x is mounted on a columnar portion 3y. The columnar. portion 3y has an outer diameter that is smaller than an inner diameter of the frame positioning hole 10 formed in the lead frame 9, and the positional accuracy of the lead frame with respect to the molds is low.

Figure 3A:
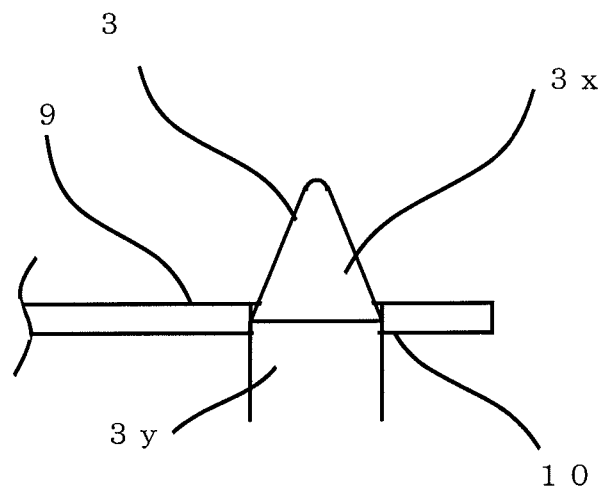
FIGS. 3A to 3C are sectional views illustrating a lead frame positioning hole and a positioning pin according to the present invention.
Figure 3B:
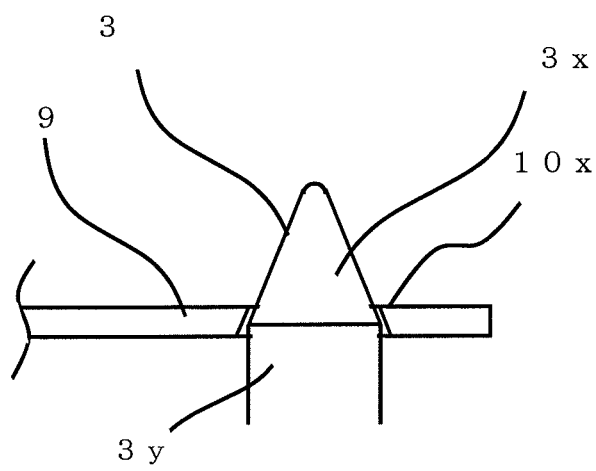
Figure 3C:
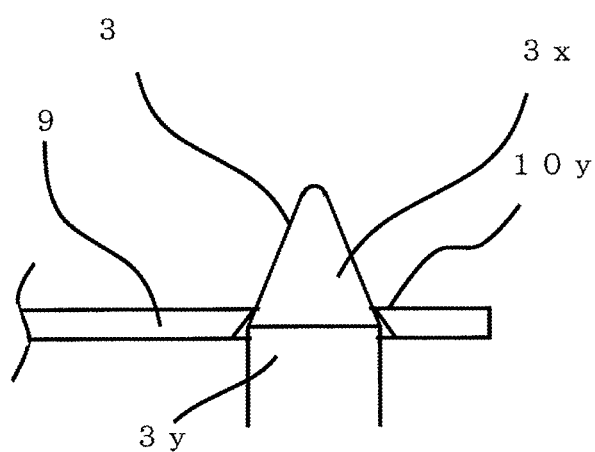

FIGS. 3A to 3C are sectional views illustrating the lead frame positioning hole and the positioning pin according to the present invention.

FIGS. 3A to 3C illustrate different shapes of the frame positioning hole. FIG. 3A illustrates an example where the columnar portion 3y of the positioning pin 3 having the shape in which the conical portion 3x is mounted on the columnar portion 3y has an outer diameter that is equivalent to or slightly larger than the inner diameter of the frame positioning hole 10. In this case, the inner diameter of the frame positioning hole 10 in the upper surface of the lead frame 9 is the same as the inner diameter of the frame positioning hole 10 in a lower surface of the lead frame 9. A boundary between the columnar portion 3y and the conical portion 3x is located within the frame positioning hole 10 in the lead frame 9. Such a structure can eliminate the related-art backlash of the lead frame on the mold due to a clearance between the positioning pin and the positioning hole, and high positional accuracy can be secured.

FIG. 3B illustrates another exemplary shape of the frame positioning hole. A frame positioning hole 10x has an isosceles trapezoidal shape in sectional view. An upper base of the trapezoid on the upper surface of the lead frame is smaller than the outer diameter of the columnar portion 3y, and a lower base of the trapezoid on the lower surface of the lead frame is larger than the outer diameter of the columnar portion 3y. Further, legs of the isosceles trapezoid form the same angle as an angle formed by tapered portions of the conical portion 3x. Therefore, the frame positioning hole 10x and the positioning pin 3 are in surface contact with each other, and thus, further improvement in positional accuracy is expected.

FIG. 3C illustrates still another exemplary shape of the frame positioning hole. A frame positioning hole 10y has an isosceles trapezoidal shape in sectional view. An upper base of the trapezoid on the upper surface of the lead frame is smaller than the outer diameter of the columnar portion 3y, and a lower base of the trapezoid on the lower surface of the lead frame is larger than the outer diameter of the columnar portion 3y. This example is different from the example illustrated in FIG. 3B in that an angle formed by legs of the isosceles trapezoid is larger than an angle formed by tapered portions of the conical portion 3x.

Figure 5:
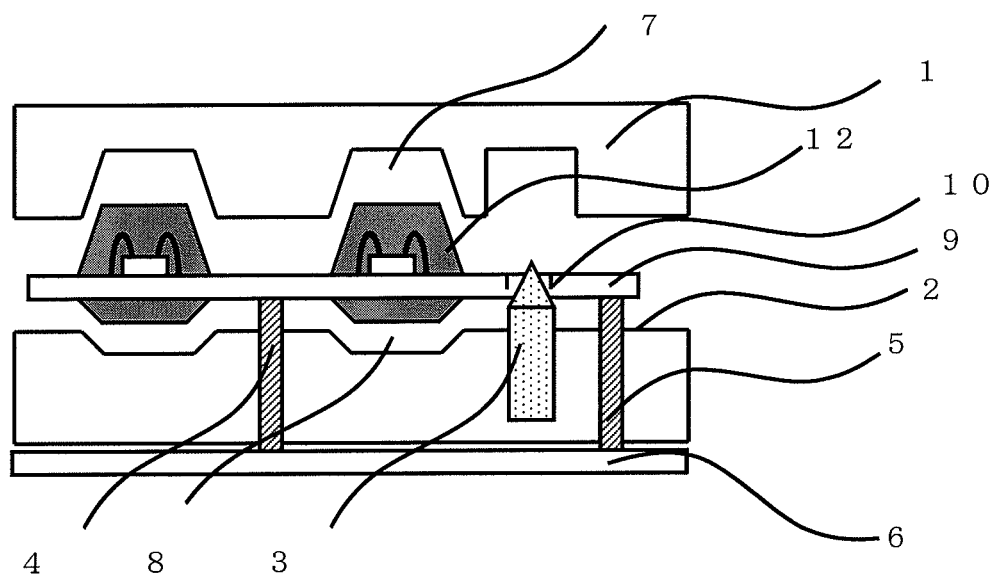
FIG. 5 is a sectional view illustrating the semiconductor manufacturing apparatus according to the first embodiment of the present invention (state in which resin encapsulation is completed and the frame is ejected out of the mold).

FIG. 5 illustrates a state in which resin encapsulation is completed and the frame is ejected out of the mold. After the semiconductor chip is encapsulated with an encapsulation resin 12, the upper mold 1 is raised and the lead frame 9 having the encapsulation resin 12 mounted thereon is pushed up by the ejector pin 4 and the ejector pin 5 in a pair that are fixed to the ejector pin coupling mechanism 6, and at the same time, the positioning pin 3 is disengaged from the frame positioning hole 10. At this time, the ejector pin 5 in a pair is provided in proximity to the positioning pin 3, and thus, the positioning pin 3 is disengaged from the frame positioning hole 10 without significant distortion of the lead frame 9. Therefore, the frame positioning hole 10 is not deformed, and high positional accuracy can be secured in steps thereafter.

In the event that high accuracy positioning is difficult due to wear of the positioning pin 3, a positioning pin rotation mechanism (not shown) provided at a bottom portion of the positioning pin may be used to slightly rotate the positioning pin 3 to enable high accuracy positioning to be secured.

Figure 6:
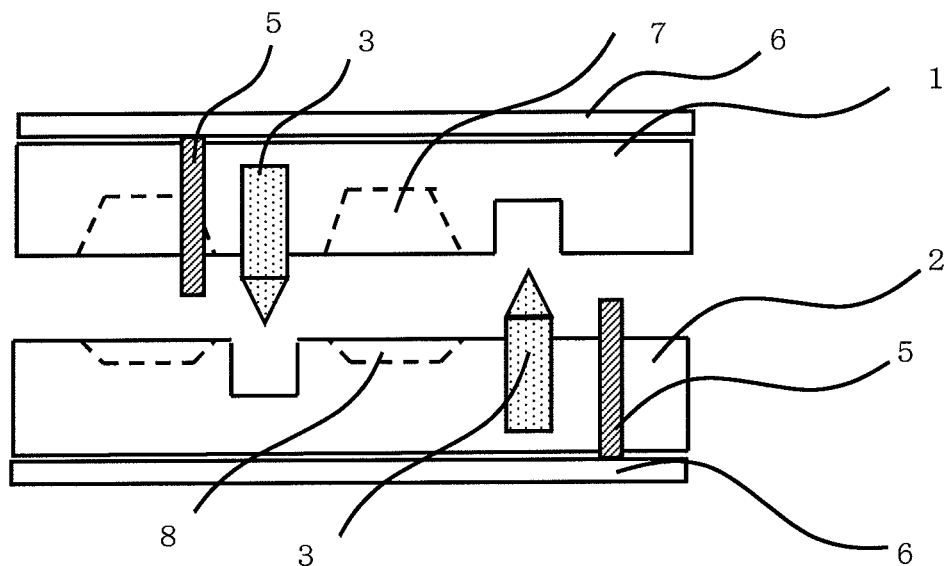
FIG. 6 is a sectional view illustrating a semiconductor manufacturing apparatus according to a second embodiment of the present invention.

FIG. 6 is a sectional view illustrating a semiconductor manufacturing apparatus according to a second embodiment of the present invention. This embodiment is different from the first embodiment in that the ejector pin 5 in a pair fixed to another ejector pin coupling mechanism is also provided to the upper mold 1 so as to be in proximity to a positioning pin 3 formed therein. As illustrated, the positioning pin 3 provided to the upper mold 1 is offset from and nonaligned with the positioning pin 3 provided to the lower mold 2. In this arrangement, the end tip portion of the positioning pin 3 of the lower mold 2 protrudes upwardly above the uppermost surface of the lower mold and the end tip portion of the positioning pin 3 of the upper mold 1 protrudes downwardly below the lowermost surface of the upper mold. Such a structure causes the lead frame mounted on the lower mold 2 to be positioned by the positioning pin 3 in the upper mold 1 when the molds are clamped, and thus, positional accuracy of the lead frame with respect to the upper mold is also improved. It is preferred that an appropriate guiding method be selected depending on which of the positional accuracy with respect to the upper mold and the positional accuracy with respect to the lower mold is valued.

Figure 7:
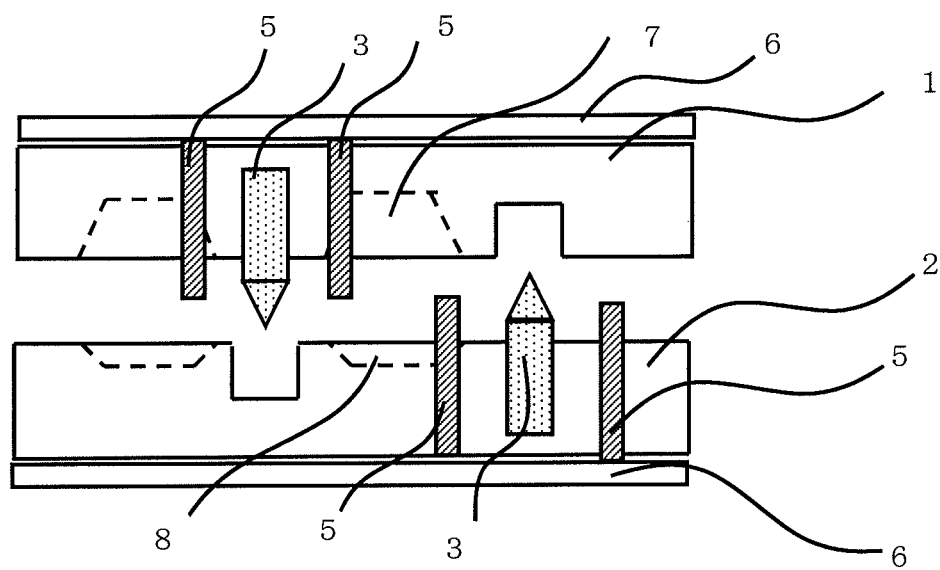
FIG. 7 is a sectional view illustrating a semiconductor manufacturing apparatus according to a third embodiment of the present invention.

FIG. 7 is a sectional view illustrating a semiconductor manufacturing apparatus according to a third embodiment of the present invention. This embodiment is different from the embodiments illustrated in FIG. 1 and FIG. 6 in that a plurality of ejector pins 5 in a group are provided for each positioning pin 3. In this case, it is preferred that the positioning pin 3 and the plurality of ejector pins 5 in a group be arranged so as to each have the same distance therebetween. Further, by arranging the plurality of ejector pins 5 in a group so as to be symmetrical with respect to the positioning pin 3, the positioning pin 3 can be disengaged from the frame positioning hole 10 in balance.

Figure 8A:
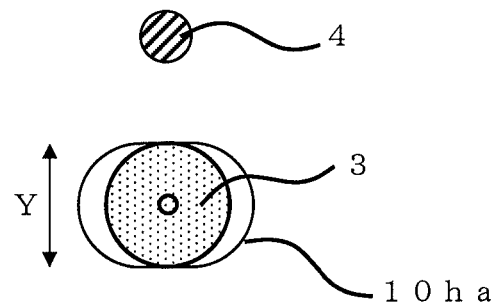
FIGS. 8A to 8C are plan views illustrating the lead frame positioning hole and the positioning pin according to the present invention.
Figure 8B:
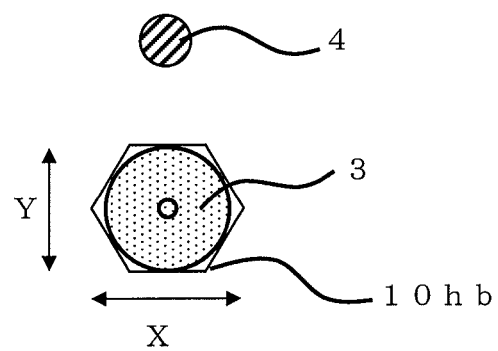
Figure 8C:
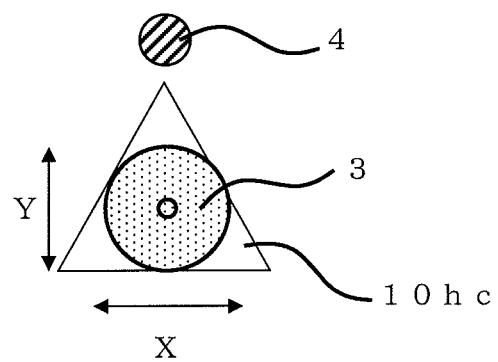

FIGS. 8A to 8C are plan views illustrating the lead frame positioning hole and the positioning pin according to the present invention.

The frame positioning hole is typically circular in plan view, but a frame positioning hole 10*ha* illustrated in FIG. 8A is oval in plan view, and the positioning pin 3 is engaged within the frame positioning hole 10*ha*. The frame positioning hole, 10*ha* has a major axis and a minor axis, and only inner surfaces of portions having the minor axis are brought into contact with a side surface of the positioning pin 3 at a plurality of contact points. Inner surfaces of portions having the major axis are apart from the side surface of the positioning pin 3. The ejector pin 4 is provided along the extension of the minor axis. Such a structure enables high accuracy positioning in a feed direction Y of the lead frame (lateral direction in FIG. 4) and reduces a contact area between the frame positioning hole 10*ha* and the positioning pin 3, which can increase a lifetime of the positioning pin 3.

In this case, the lifetime of the positioning pin 3 is determined depending on wear of contact points thereof with the lead frame. When the contact points of the positioning pin 3 are worn and the lead frame cannot be fed with high accuracy, the positioning pin 3 is slightly rotated. The portions of the positioning pin 3 that are not worn become new contact points with the lead frame to enable feeding of the lead frame with high accuracy. Note that, it is enough that the positioning pin 3 be rotated so that the worn portions thereof do not become contact points with the lead frame, and a rotation angle is about 10 to 15 degrees at a time. When the positioning pin 3 is further worn during use, the positioning pin 3 may be rotated again so that the worn portions thereof are not brought into contact with the lead frame.

FIGS. 8B and 8C illustrate a hexagonal frame positioning hole 10*hb* and a triangular frame positioning hole 10*hc*, respectively, according to other embodiments of the present invention. FIG. 8A illustrates an example where high accuracy positioning can be performed only in the lead frame feed direction Y. By using a polygonal frame positioning hole such as a hexagonal or triangular frame positioning hole, high accuracy positioning can be performed not only in the lead frame feed direction Y but also in a lead frame width direction X.

Further, a regular polygonal positioning hole and an inscribed circular positioning pin 3 are used in combination. Thus, the regular polygonal positioning hole and the inscribed circular positioning pin 3 are held in point contact with each other in plan view, and the contact area therebetween is quite small. Therefore, when the contact points of the positioning pin 3 are worn and high accuracy positioning cannot be performed, the positioning pin 3 is slightly rotated so as to create new contact points, to thereby enable high accuracy positioning. Note that, it is desired that the number of vertices of the regular polygon be three to eight.

What is claimed is:

1. A semiconductor device manufacturing apparatus for encapsulating with a resin a semiconductor chip mounted on a lead frame, the semiconductor device manufacturing apparatus comprising:
    an upper mold and a lower mold configured to receive therebetween a lead frame on which a semiconductor chip is mounted;
    a positioning pin provided to the lower mold and configured to be received by a positioning hole provided in the lead frame; and
    a plurality of ejector pins provided in proximity to the positioning pin and arranged so as to be symmetrical with respect to the positioning pin.

2. A semiconductor device manufacturing apparatus according claim 1, further comprising another positioning pin provided to the upper mold; and wherein the plurality of ejector pins comprises a first pair of ejector pins disposed in proximity to and arranged so as to be symmetrical with the tapered positioning pin provided to the lower mold, and a second pair of ejector pins disposed in proximity to and arranged so as to be symmetrical with the tapered positioning pin provided to the upper mold.

3. A semiconductor device manufacturing apparatus for encapsulating with a resin a semiconductor chip mounted on a lead frame, the semiconductor device manufacturing apparatus comprising:
    an upper mold and a lower mold configured to receive therebetween a lead frame on which a semiconductor chip is mounted;
    a first positioning pin provided to the lower mold;
    a second positioning pin provided to the upper mold;
    at least one first ejector pin provided in proximity to the first positioning pin; and at least one second ejector pin provided in proximity to the second positioning pin;

wherein the first positioning pin and the second positioning pin are offset from one another and are configured to be received by different positioning holes provided in the lead frame, and wherein the first positioning pin has an end tip portion that protrudes upwardly above an uppermost surface of the lower mold and the second positioning pin has an end tip portion that protrudes downwardly below a lowermost surface of the upper mold.

4. A semiconductor device manufacturing apparatus according to claim 3, wherein the at least one first ejector pin comprises a pair of first ejector pins; and wherein the at least one second ejector pin comprises a pair of second ejector pins.

5. A semiconductor device manufacturing apparatus according to claim 4, wherein the pair of first ejector pins are arranged so as to be symmetrical to the first positioning pin; and wherein the pair of second ejector pins are arranged so as to be symmetrical to the second positioning pin.

6. A semiconductor device manufacturing apparatus according to claim 3, wherein each of the first positioning pin and the second positioning pin has a tapered conical tip portion.

7. A semiconductor device manufacturing apparatus according to claim 3, wherein the semiconductor chip mounted on the lead frame which the upper mold and the lower mold are configured to receive is encapsulated with a resin; and wherein the at least one first ejector pin and the at least one second ejector pin are configured to push the lead frame, but not the encapsulated semiconductor chip, to eject the lead frame from the upper and lower molds.

8. A semiconductor device manufacturing apparatus according to claim 1, wherein the positioning pin has a tapered conical tip portion.

9. A semiconductor device manufacturing apparatus according to claim 1, wherein the semiconductor chip mounted on the lead frame which the upper mold and the lower mold are configured to receive is encapsulated with a resin; and wherein the plurality of ejector pins are configured to push the lead frame, but not the encapsulated semiconductor chip, to eject the lead frame from the upper and lower molds.

10. A semiconductor device manufacturing apparatus for encapsulating with a resin a semiconductor chip mounted on a lead frame, the semiconductor device manufacturing apparatus comprising:

an upper mold and a lower mold configured to receive therebetween a lead frame on which a semiconductor chip is mounted;

a first positioning pin provided to the lower mold, the first positioning pin having a tapered conical tip portion;

a second positioning pin provided to the upper mold, the second positioning pin having a tapered conical tip portion;

at least one first ejector pin provided in proximity to the first positioning pin; and at least one second ejector pin provided in proximity to the second positioning pin.

11. A semiconductor device manufacturing apparatus according to claim 10, wherein the at least one first ejector pin comprises a pair of first ejector pins; and wherein the at least one second ejector pin comprises a pair of second ejector pins.

12. A semiconductor device manufacturing apparatus according to claim 11, wherein the pair of first ejector pins are arranged so as to be symmetrical to the first positioning pin; and wherein the pair of second ejector pins are arranged so as to be symmetrical to the second positioning pin.

13. A semiconductor device manufacturing apparatus according to claim 10, wherein the semiconductor chip mounted on the lead frame which the upper mold and the lower mold are configured to receive is encapsulated with a resin; and wherein the at least one first ejector pin and the at least one second ejector pin are configured to push the lead frame, but not the encapsulated semiconductor chip, to eject the lead frame from the upper and lower molds.

* * * * *